(12) United States Patent
Aluru et al.

(10) Patent No.: US 10,318,409 B2
(45) Date of Patent: *Jun. 11, 2019

(54) APPLICATION DEVELOPMENT ENVIRONMENT FOR PORTABLE ELECTRONIC DEVICES

(71) Applicant: Microsoft Technology Licensing, LLC, Redmond, WA (US)

(72) Inventors: Vamsee R K Aluru, Hyderabad (IN); Pankaj Kachrulal Sarda, Hyderabad (IN); Madhu Vadlapudi, Hyderabad (IN)

(73) Assignee: Microsoft Technology Licensing, LLC, Redmond, WA (US)

( * ) Notice: Subject to any disclaimer, the term of this patent is extended or adjusted under 35 U.S.C. 154(b) by 80 days.

This patent is subject to a terminal disclaimer.

(21) Appl. No.: 15/384,068

(22) Filed: Dec. 19, 2016

(65) Prior Publication Data

US 2017/0161175 A1  Jun. 8, 2017

Related U.S. Application Data

(63) Continuation of application No. 13/158,345, filed on Jun. 10, 2011, now Pat. No. 9,535,817.

(51) Int. Cl.
  *G06F 17/50* (2006.01)
  *G06F 19/00* (2018.01)
  (Continued)

(52) U.S. Cl.
  CPC ...... *G06F 11/3664* (2013.01); *G06F 11/3652* (2013.01); *G06F 17/5022* (2013.01)

(58) Field of Classification Search
  CPC ...... G06F 8/34; G06F 17/5009; G06F 11/323; G06F 11/3664; G06F 2209/544;
  (Continued)

(56) References Cited

U.S. PATENT DOCUMENTS 5,440,697 A  8/1995  Boegel et al.
5,764,956 A  6/1998  Akahori et al.
(Continued)

OTHER PUBLICATIONS

Varshney et al., SenQ: a scalable simulation and emulation environment for sensor networks, 10 pages (Year: 2007).*
(Continued)

*Primary Examiner* — Thuy Dao
(74) *Attorney, Agent, or Firm* — Fiala & Weaver P.L.L.C.

(57) ABSTRACT

A method for developing and testing an application for a device with one or more sensors using a sensor emulation environment that may allow testing of the application in a programmatic manner. The sensor emulation environment may emulate actual physical sensors. The sensor emulation environment may receive sensor simulation data from multiple types of sources of sensor data. A sensor data engine may receive sensor simulation data from a selected data source via an API. The data engine may provide data values at times that represent operation of a sensor. The sensor emulation environment may further include a sensor interface component that emulates a hardware interface to the emulated sensor in a physical target device such that application components, such as a driver, may interact with the sensor emulation environment.

20 Claims, 6 Drawing Sheets

(51) Int. Cl.
*G06F 17/18* (2006.01)
*H04L 29/08* (2006.01)
*G06F 11/36* (2006.01)

(58) Field of Classification Search
CPC .......... G06F 2209/545; G06F 11/3652; G06F 17/5022; G06F 17/30864; G06F 17/18; G06F 19/00; G06F 9/455
See application file for complete search history.

(56) References Cited

U.S. PATENT DOCUMENTS

| | | | |
|---|---|---|---|
| 6,549,881 B1* | 4/2003 | Dearth | G06F 11/261 703/21 |
| 6,658,633 B2 | 12/2003 | Devins et al. | |
| 6,766,520 B1 | 7/2004 | Rieschl et al. | |
| 6,997,803 B2 | 2/2006 | LeMay et al. | |
| 7,356,455 B2 | 4/2008 | Quayle et al. | |
| 7,613,599 B2 | 11/2009 | Bade et al. | |
| 7,987,086 B2 | 7/2011 | Van Huben et al. | |
| 8,239,840 B1 | 8/2012 | Czymontek | |
| 8,793,117 B1* | 7/2014 | Varshney | H04L 69/18 703/21 |
| 8,812,171 B2* | 8/2014 | Filev | B60W 50/10 701/1 |
| 8,874,776 B2* | 10/2014 | Serban | G06F 11/3664 709/201 |
| 9,058,447 B2 | 6/2015 | Clark et al. | |
| 9,104,791 B2* | 8/2015 | Cohen | G06F 19/321 |
| 9,195,786 B2 | 11/2015 | Stamness et al. | |
| 9,830,407 B2* | 11/2017 | Newcombe | G06F 17/5004 |
| 2003/0061401 A1 | 3/2003 | Luciani, Jr. | |
| 2003/0229801 A1 | 12/2003 | Kouznetsov et al. | |
| 2005/0015702 A1 | 1/2005 | Shier et al. | |
| 2005/0216829 A1 | 9/2005 | Kalinichenko et al. | |
| 2005/0228627 A1 | 10/2005 | Bellantoni et al. | |
| 2006/0072466 A1 | 4/2006 | Wang et al. | |
| 2006/0265718 A1 | 11/2006 | Tsang et al. | |
| 2007/0168744 A1 | 7/2007 | Pal et al. | |
| 2008/0021679 A1* | 1/2008 | Bleiweiss | A63F 13/00 703/2 |
| 2008/0201453 A1 | 8/2008 | Assenmacher | |
| 2008/0301231 A1 | 12/2008 | Mehta et al. | |
| 2009/0006129 A1* | 1/2009 | Thukral | G06F 19/3437 705/2 |
| 2009/0030926 A1 | 1/2009 | Aharoni et al. | |
| 2009/0031303 A1 | 1/2009 | Frank | |
| 2009/0106604 A1 | 4/2009 | Lange et al. | |
| 2009/0213083 A1 | 8/2009 | Dicker et al. | |
| 2010/0003923 A1* | 1/2010 | McKerlich | H04L 12/14 455/67.11 |
| 2010/0033425 A1 | 2/2010 | Shasek et al. | |
| 2010/0142593 A1 | 6/2010 | Schmid | |
| 2010/0214301 A1 | 8/2010 | Li et al. | |
| 2011/0055846 A1 | 3/2011 | Perez et al. | |
| 2011/0074702 A1 | 3/2011 | Pertuit et al. | |
| 2011/0173239 A1 | 7/2011 | Sayed et al. | |
| 2011/0271156 A1 | 11/2011 | Chhabra | |
| 2012/0089978 A1 | 4/2012 | Kung et al. | |
| 2012/0280934 A1* | 11/2012 | Ha | G06F 3/0416 345/174 |

OTHER PUBLICATIONS

Damm et al., Using transaction level modeling techniques for wireless sensor network simulation, 6 pages (Year: 2010).*

"Final Office Action Issued in U.S. Appl. No. 13/158,345", dated Apr. 14, 2014, 14 Pages.

"Final Office Action Issued in U.S. Appl. No. 13/158,345", dated Jan. 30, 2015, 22 Pages.

"Final Office Action Issued in U.S. Appl. No. 13/158,345", dated Aug. 14, 2015, 13 Pages.

"Final Office Action Issued in U.S. Appl. No. 13/158,345", dated May 26, 2016, 8 Pages.

"Non Final Office Action Issued in U.S. Appl. No. 13/158,345", dated Nov. 27, 2015, 16 Pages.

"Non Final Office Action Issued in U.S. Appl. No. 13/158,345", dated Apr. 28, 2015, 13 Pages.

"Non Final Office Action Issued in U.S. Appl. No. 13/158,345", dated Aug. 6, 2014, 15 Pages.

"Non Final Office Action Issued in U.S. Appl. No. 13/158,345", dated May 6, 2013, 16 Pages.

"Non Final Office Action Issued in U.S. Appl. No. 13/158,345", dated Oct. 29, 2013, 11 Pages.

"Notice of Allowance Issued in U.S. Appl. No. 13/158,345", dated Aug. 26, 2016, 9 Pages.

Cho, Sang-Young, "A Virtual Simulation Package for Embedded System Training and Education", In Proceedings of IEEE International Conference on Engineering Education, Dec. 7, 2009, pp. 72-76.

Faisstnauer, et al, "Device-Independent Navigation and Interaction in Virtual Environments", In Proceedings of the VRST Adjunct Workshop on Computer Graphics, Nov. 5, 1998, 8 Pages.

Fournier, Jonathan, "Model Building with Core Manufacturing Simulation Data", In Proceedings of Winter Simulation Conference, Dec. 11, 2011, pp. 2219-2227.

Raffetseder, et al, "Detecting System Emulators", In Proceedings of the 10th International Conference on Information Security, Oct. 9, 2007, 18 Pages.

* cited by examiner

APPLICATION DEVELOPMENT ENVIRONMENT FOR PORTABLE ELECTRONIC DEVICES

CROSS-REFERENCE TO RELATED APPLICATIONS

This application is a continuation of U.S. patent application Ser. No. 13/158,345 filed Jun. 10, 2011 and entitled "APPLICATION DEVELOPMENT ENVIRONMENT FOR PORTABLE ELECTRONIC DEVICES," which is incorporated herein by reference in its entirety.

BACKGROUND

As computing devices become more versatile, devices are able to accept multiple types of input data. Specifically, mobile computing devices may be equipped with a number of sensors that generate data for use by applications. For example, a computing device may receive touch data via a touch screen, global positioning system (GPS) tracking data via a GPS sensor, as well as input data collected via an accelerometer, gyroscope sensor and other peripheral devices.

Computing devices having one or more sensors may execute applications that process sensor data collected via the sensors. In developing and testing such applications, software developers typically rely on the presence of the devices.

SUMMARY OF INVENTION

A framework is provided that facilitates development and testing of an application for a device equipped with one or more sensors. The framework may include a guest environment in which the application may execute. The framework may also include a sensor emulation environment in which data simulating sensor data may be generated and provided to the application in a format emulating operation of sensors on the device. The framework can receive simulated sensor data from any of a number of different types of data sources such that the framework can emulate sensors on a device in a way that is appropriate for any of a wide range of operations during the development or test of an application.

Even though the device may not be available during either or both the development or testing of the application, one or more of the data sources may be selected, for example, to provide a way to assess behavior of the application in multiple scenarios in a reproducible manner. Data sources, such as a file or a process, within the framework or possibly on another computing device entirely, may be used to generate data that is readily repeatable. In contrast, in other scenarios, testing or development may entail allowing a user to interact with a proxy device that has sensors that can generate data that simulates outputs of sensors on a target device on which the application is designed to execute, even if the target device is not available.

In one aspect, the sensor emulation environment may connect to a source of sensor simulation data, regardless of the type of the source selected. A suitable source of sensor simulation data may be selected based on the application functionality that is desired to be tested. The data source may comprise a storage location, such as a file, a process, or an actual device that is collecting sensor data in real time. The actual device may be different from a target device to execute the application. The data source may also be a simulation model for generating the sensor simulation data.

To connect to these and other types of data sources, the framework may include an application programming interface (API) for receiving the sensor simulation data from any suitable data source. The API may act as a bridge between one or more sources of the sensor simulation data and the sensor emulation environment. The API may accept the sensor simulation data as programmatic input, which may speed up the testing of the application and enable a developer to automatically test the application.

In a further aspect, the sensor simulation data received by the API may be provided to a sensor data engine in the sensor emulation environment. The sensor data engine may provide the sensor simulation data to the application via one or more sensor interface objects. The sensor data engine may determine the sensor interface objects that will provide the sensor simulation data to the application. The determination may be based on parameters of the sensor simulation data. For example, the sensor simulation data may be associated with an identifier for a sensor interface object to receive the data from the sensor data engine and provide the data to the application.

The foregoing is a non-limiting summary of the invention, which is defined by the attached claims. It should be appreciated that the foregoing techniques may be used together, singly or in any suitable combination.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
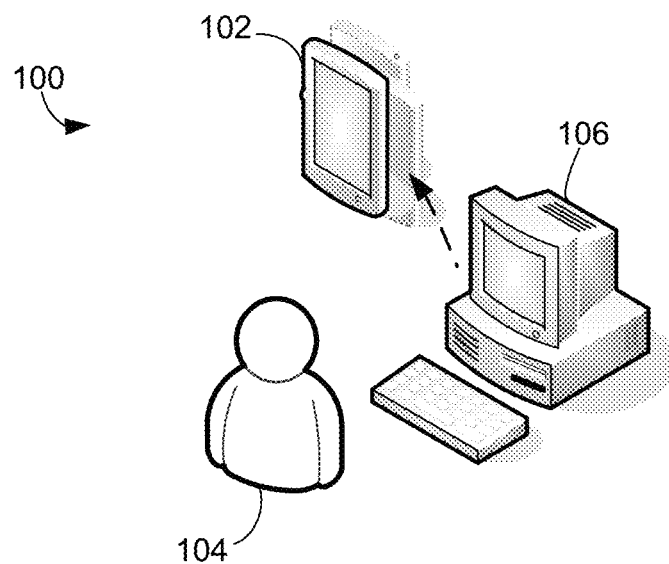
FIG. 1 is a sketch of a prior art development and testing environment.

Applicants have recognized and appreciated that development and testing of an application for a mobile device having one or more sensors may be facilitated by providing a framework that can both host an application under development and emulate sensors that would exist in the mobile device. The framework can allow development and testing of an application for a mobile device, even when that mobile device is not available. Further, the framework can be controlled programmatically such that the sensor data provided to the application can both be specifically defined and applied in a repeatable fashion. As a result, the framework may permit the application to be tested and developed in a faster and a more efficient manner. Moreover, the framework may enable automatic testing of the application in different contexts or repeated testing under the same conditions without variability associated with using actual sensor data.

In some embodiments, the framework may include a sensor emulation environment that emulates functionality of physical sensors and generates simulated sensor data, thus eliminating the requirement of utilizing an actual device for application testing and development. As a result, testing of the application for use in a device may begin before the device is available. The framework may operate as a host environment for a guest application environment in which the application undergoing testing may be executed with one or more processors.

In some embodiments, the framework described herein allows testing the application in a programmatic manner. Accordingly, the development environment may enable a developer to perform automatic testing of the application. The tests performed in such controlled environment may be repeated and/or adjusted by repeatedly using the same source of sensor simulation data or by varying the source of sensor simulation data. A suitable mechanism for reporting results of the testing may also be implemented. Moreover, multiple types of tests for different contexts in which the application executes may be performed. As a result, the framework expedites and simplifies the process of development and testing of an application for a device equipped with one or more sensors.

A suitable component, such as a test controller, may manage testing of the behavior of the application within the development environment. The test controller may operate automatically, in response to user input, or in other suitable manner. The test controller, for example, may stimulate the application or collect results from the application while executing in the guest application environment. The test controller may also control selection of a source of sensor simulation data and may also control timing of operation of components within the sensor emulation environment to ensure that simulated sensor data is provided to the application at times that are coordinated with inputs or outputs of the application.

The sensor emulation environment may connect to any suitable source of sensor simulation data. Examples of sensor data that may be simulated include: multi-touch data, GPS data, accelerometer, gyroscope, magnetometer, compass and any other suitable data. These types of data may be obtained from any of a number of types of data sources. In some embodiments, a source of the sensor simulation data may be a simulation model that may generate the sensor simulation data in any suitable manner. A simulation model may execute in a separate process in the development environment or may possibly execute in an external computing device. Any suitable simulation models may be implemented, as embodiments of the invention are not limited in this respect. Accordingly, it should be appreciated that the data may be of any suitable type and format and may include any number of data points.

Data used to provide simulated sensor data may be obtained from any suitable data source. For example, sensor simulation data that have been previously stored may be provided to the sensor emulation environment from a suitable storage location, such as, for example, a file. Additionally or alternatively, the input data for simulating a sensor may be generated by execution of a suitable program, which may be executed in the same or a different process as the sensor emulation environment, and may be structured as a simulation model or in any other suitable form.

The data for simulating sensors may be captured and stored in advance of being provided to the sensor emulation environment or may be provided to the environment in real time as it is generated. In some embodiments, the sensor data may be received in real time in a form of raw sensor data being collected from any suitable device equipped with sensors. The sensor data may be obtained from a target device for which the application is being developed and tested. However, in some scenarios, sensor data may be obtained from another device, acting as a proxy device, that is different from the target device. An exemplary device providing such data from one or more sensors may be a personal computer, a mobile phone, Microsoft© Xbox™ game device, or any other device. The sensor data may be collected while a user is manipulating the device (e.g., is shaking or otherwise moving a mobile phone). Accordingly, it should be appreciated that embodiments are not limited with respect to a type of the source of the sensor simulation data and any suitable source may be utilized.

The sensor data source may be selected based on any suitable criteria, such as, for example, a way in which the application is tested. For example, when the same test is repeatedly run on the application, a file may be selected as a sensor data source. In other scenarios, when it is desirable to see a change in behavior of application in response to actual user actions, the sensor data source may be a proxy device providing actual sensor data as the device is being moved or otherwise manipulated. The proxy device may be a target device to execute the application or a different device having one or more sensors.

The sensor emulation environment may comprise an application programming interface (API) that may accept sensor simulation data from multiple types of data sources. Such an API may facilitate input of sensor simulation data to the sensor emulation environment from any source.

Regardless of the source of the sensor simulation data, the data may be processed within the sensor emulation environment to provide the data to an application under development or test in a format and with a timing that emulates data that the application will receive from sensors when actually executing on the target device. A sensor data engine may control the timing of each data point supplied to the application. A sensor interface component may provide an interface that emulates an interface to a sensor in the target device. In the exemplary embodiments described herein, such a sensor interface component is implemented as an object, containing, for example, functions that can be called through defined interfaces. Though, it should be appreciated that any suitable format may be used to implement the sensor interface component and other components described herein.

In operation, the sensor data engine in the sensor emulation environment may receive the sensor simulation data from the API and provide it to the application via one or more sensor interface objects. The sensor data engine may process the input sensor simulation data and, based on parameters of the data, such as a type and an identifier of a sensor to be emulated with the data, may supply the data to a corresponding sensor interface object. In some embodiments, a different sensor interface object may be provided for each sensor to be emulated. Though, it should be appreciated that a separate object is not required. For example, accelerometer data may comprise readings along x, y and z axis, which may be provided through one sensor interface object or through multiple such objects.

Each sensor interface object may thus act as an interface between the sensor data engine and the application to provide the sensor simulation data to the application in a way that emulates an interface of an actual physical sensor. The API, sensor data engine and sensor interface objects may be implemented in any suitable manner. In some embodiments, these components may be software objects executed with one or more processors.

Any suitable mechanism may be used to trigger the provision of data, simulating operation of a sensor, and the mechanism may depend on the operation of the physical sensors in the target device, the coding of the application under development and test and/or other factors, such as a test being performed. The framework in accordance with some embodiments may provide sensor simulation data to an application being tested in different operating modes. In a first, "push," operating mode, the sensor simulation data may be fed into the application. In a second operating mode, which may be referred as a "pull" mode, sensor data may be requested by the application, for example, via a driver for use in operation of the application.

In the "push" operating mode, a suitable component in the development environment may trigger the sensor data engine to provide sensor data to the application. Such component may be, for example, a test controller or other suitable component managing the testing of the application. Thereafter, the sensor data engine may provide data points at times determined based on the received sensor simulation data so that the data that is supplied to a sensor interface object has both values and timing that emulates an output of a physical sensor under a scenario represented by selected sensor simulation data. Thus, the test controller may run a set of tests on the application and feed sensor simulation data to the application for this purpose, with different sensor simulation data, possibly from different data sources, used in each test.

In the "pull" operating mode, sensor data may be requested from the sensor emulation environment. This request may be initiated by any suitable component in the application environment, such as the application under development and test or a driver for use in operation of the application. The request may be received in the sensor emulation environment via an appropriate sensor interface object. The sensor interface object may communicate the request to the sensor data engine, which may trigger the sensor data engine to supply data simulating operation of the sensor. Specific data values may be selected for provision to the application at different times, with the values selected at different times based on information included within the sensor simulation data or in any other suitable way.

Regardless of the manner in which the provision of data is triggered, the sensor simulation data may comprise a single value or a series of values. It should be appreciated that embodiments of the invention are not limited to a number of data points in the sensor simulation data. Moreover, when the data is a series of values, it is not a requirement that every data value generated by the sensor data engine be supplied to the application. Any suitable interface strategy may be used to actually provide the data values to the application.

In some embodiments, the sensor data engine may generate a series of data values, each of which is provided to a sensor interface object. Whether each data value is provided to the application may depend on the hardware design of the sensor in the target device. For example, if the sensor in the target device issues an interrupt for each sensor value generated, the sensor interface object may similarly issue an interrupt as each data value in the stream is received from the sensor data engine. Such an interrupt may trigger processing of each data value in the application, or at least a driver, associated with the application and running in the guest environment. Alternatively, the sensor interface object may store the most recent value in the data series received from the sensor data engine and provide it to the application, or associated driver, in response to a request.

Though, even when the simulated sensor data is represented by a series of values, it is not a requirement that the sensor data engine output that entire series. In some embodiments, for example, the sensor data engine may determine a new data value in response to a request from a sensor interface object. The sensor data engine may determine an appropriate value, representing a value in the series of values at a time the request is received or as otherwise specified as part of the request. In such an embodiment, the sensor interface object may be configured to request data values from the sensor data engine at times that represent times at which a physical sensor in the target device would supply data values.

Regardless of how the data values in a series are made available to an application, the sensor data engine may employ a suitable mechanism to generate data values at times that make the data, in total, representative of changing values that may be provided by a sensor in the physical target device. Accordingly, timing information may be provided to the sensor data engine in conjunction with sensor simulation data. This timing information may indicate one or more timing parameters.

One such parameter may indicate when, relative to the initiation of a test or other event, the data values in a series are applicable. This parameter may be indicated as a start time of the data series. For example, a source of sensor simulation data may provide a series of values representative of the output of a motion sensor during a specific motion of the target mobile device. A timestamp may be associated with that data series, or with each point in the data series, indicating, as a specific example, that the sensor emulation environment should generate data representing such a motion starting five seconds after the beginning of a test.

Accordingly, in some embodiments, each data point, or each series of data points, in the sensor simulation data may be associated with a time value indicating a time when the data or series are applicable. A value for such a timestamp may be set in any suitable manner. A value for the timestamp may be set, for example, by a test engineer developing tests for an application under development. This data may be included as part of the data obtained through an API interfacing the sensor emulation environment and a data source. Though, it should be appreciated that the value of such a timestamp may be provided to the sensor data engine in any suitable way, including from a test controller supervising automatic testing of the application.

Though, it is not a requirement that the start time of each data series be specified in relation to a pre-defined time scale, such as a time scale for conducting a test. The start time for data values may be based on events during operation of the sensor emulation environment. For example, the start time may be implied based on a request or command from the application being developed or tested, the test controller or other component within the environment. Alternatively or additionally, the sensor simulation data may be supplied to the sensor emulation environment in real time, such as from a proxy device being moved by a user, from a process executing a sensor simulation model or in other suitable manner, which would inherently indicate when the data is applicable. In such cases, the timestamp may not be present or may have a value indicating that the start time for the data will be specified by an event or that the data is being supplied in real time.

Another time parameter associated with sensor simulation data may indicate when, relative to a start time for a data series, each data value in the data series is applicable. Accordingly, additionally or alternatively, in some embodiments, each data point in the sensor simulation data may be associated with an offset value indicating a relation between data specified start time and a time when the data value is applicable. The offset values may be used to emulate actual timing relationships between the data points, as if the sensor simulation data were supplied from an actual sensor. These offset values may be applied relative to a start time for data values, regardless of the form in which the start time is specified.

The offset values may be obtained in any suitable way. For example, when the sensor simulation data has been recorded as the output of a physical sensor, the offset values may indicate a sampling time for the data points as they were received from an actual physical sensor. For example, sensor simulation data may be recorded while the physical sensor is being operated as part of performing a motion or gesture with a device containing the sensor. As a result, a series of values of the sensor simulation data may represent a gesture, such as a shake of a device or any other suitable movement of the device. Alternatively, the offsets may be generated by a sensor model or other mechanism generating the sensor simulation data.

Regardless of the source of the timing information, it may be used by the sensor data engine to determine, at any time, an appropriate data value to simulate the output of a sensor. This information may be used regardless of whether the sensor data engine is being operated in a "push" mode or a "pull" mode. Nonetheless, the data supplied by the sensor data engine may simulate output of a physical sensor in a target device under any suitable conditions. This data, however, can be easily generated in a development environment without actually creating the conditions with the application executing on a physical copy of the target device.

A framework described herein may be used in any suitable environment to test an application under development for a portable electronic device or other device equipped with one or more sensors.

FIG. 1 illustrates a prior art computing environment 100 which may be used to test an application for a target device 102 that has one or more sensors. Device 102 may be a portable mobile device, such as, for example, a Smartphone, a personal digital assistant or other device. In such an environment, user 104 (e.g., a software developer) may utilize a computer 106, such as a conventional personal computer, to develop an application for use in device 102. The presence of device 102 may be required for the testing purposes.

Some portions of the application for execution on device 102 that do not require sensor data to be provided to the application may be tested on computer 106. To test behavior of other portions of the application that require sensor data for testing, the application may need to be loaded to device 102. Accordingly, the computing environment 100 relies on the presence of device 102 for application testing. As illustrated schematically in FIG. 1, during the testing of such portions, device 102 may be shaken or otherwise moved in order to cause the sensors of the device to generate sensor data for testing the application in various scenarios. In this example, device 102 is schematically shown to be shaken to generate sensor data.

The inventors have recognized and appreciated that this approach to testing can lengthen application development time. In many scenarios, when an application for a device with one or more sensors is being tested, the device itself may not be available. Furthermore, even when the device is present, it may not be practical to use it for generation of sensor data for software development and testing purposes. For example, when sensor data is generated from the device in real time and fed to the application, results of tests using such data may depend on the specific way in which the device is moved, which may be different each time a test is executed. The results of tests conducted in this fashion may not be reproducible.

Accordingly, a framework, as described herein, may be used that provides a development environment in which sensor data may be provided to the application as sensor simulation data. In some embodiments, the sensor simulation data may be provided to the application under development and testing in a programmatic manner. This enables automatic testing of the application, which may expedite and improve the overall efficiency of the application development process.

Figure 2:
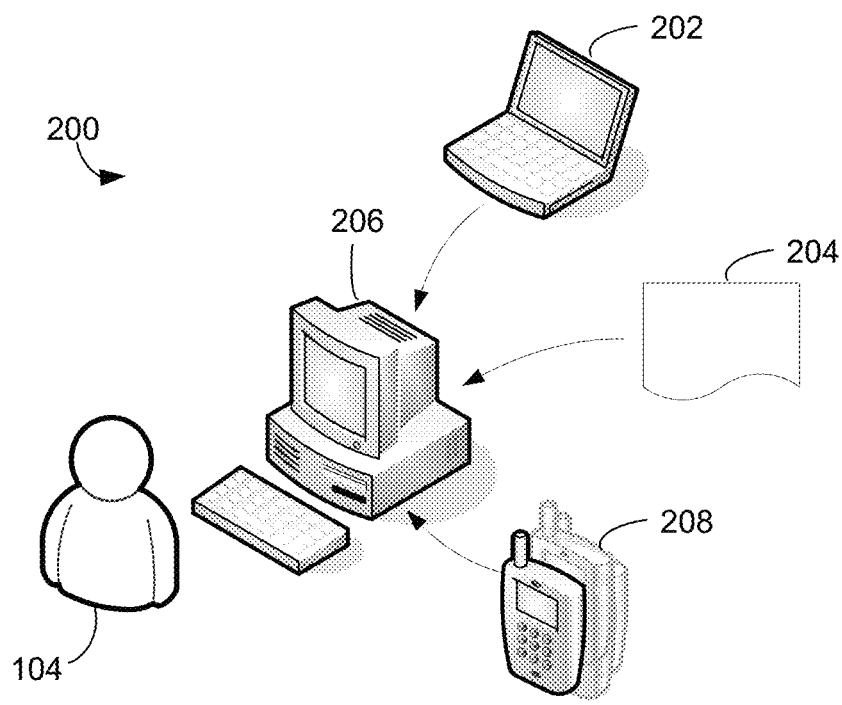
FIG. 2 is a sketch of a development and testing environment in which some embodiments of the invention may be implemented.

FIG. 2 illustrates a computing environment 200 in which some embodiments of the invention may be implemented. Computing environment 200 may include a computing device 206 for development and testing an application. Computing device 206 may provide a development environment for applications, like computer 106 shown in FIG. 1. However, the development environment in computer 206 may emulate one or more sensors to provide sensor data to test an application without the need to load the application on the device where such sensors are available. Such sensor emulation may be provided by the framework described herein.

User 104 may operate computer 206 in which the framework may be implemented. However, as shown in FIG. 2, the need for target device 102 may be eliminated due to the ability of the framework to provide sensor data from other sources, which may be done in a programmatic manner.

As shown in FIG. 2, computer 206 executing the application being tested may receive sensor data from any suitable data source. Exemplary sources of sensor data in FIG. 2 may be a laptop 202, a file 204, and/or a proxy device such as a mobile phone 208. Though, the target device may also be a mobile phone, using another mobile phone as a proxy device may allow a person manipulating mobile phone 208 to observe how the application might respond when the user is actually interacting with the application loaded on the target device. Though, such testing may be conducted even before the target device is available. It should be appreciated that embodiments of the invention are not limited with respect to any particular source of sensor data and sensor data may be received from any suitable data source. It should be appreciated that embodiments are not limited with respect to a type of the source of the sensor simulation data and any suitable source may be utilized.

In some embodiments, the framework may provide to the application sensor data as sensor simulation data received from any suitable data source. The sensor simulation data received from a sensor data source may be previously recorded or received in real time. For example, the data source may comprise file 204 storing previously recorded sensor simulation data. The stored sensor simulation data may be actual sensor data collected and recorded in any suitable format.

Figure 3:
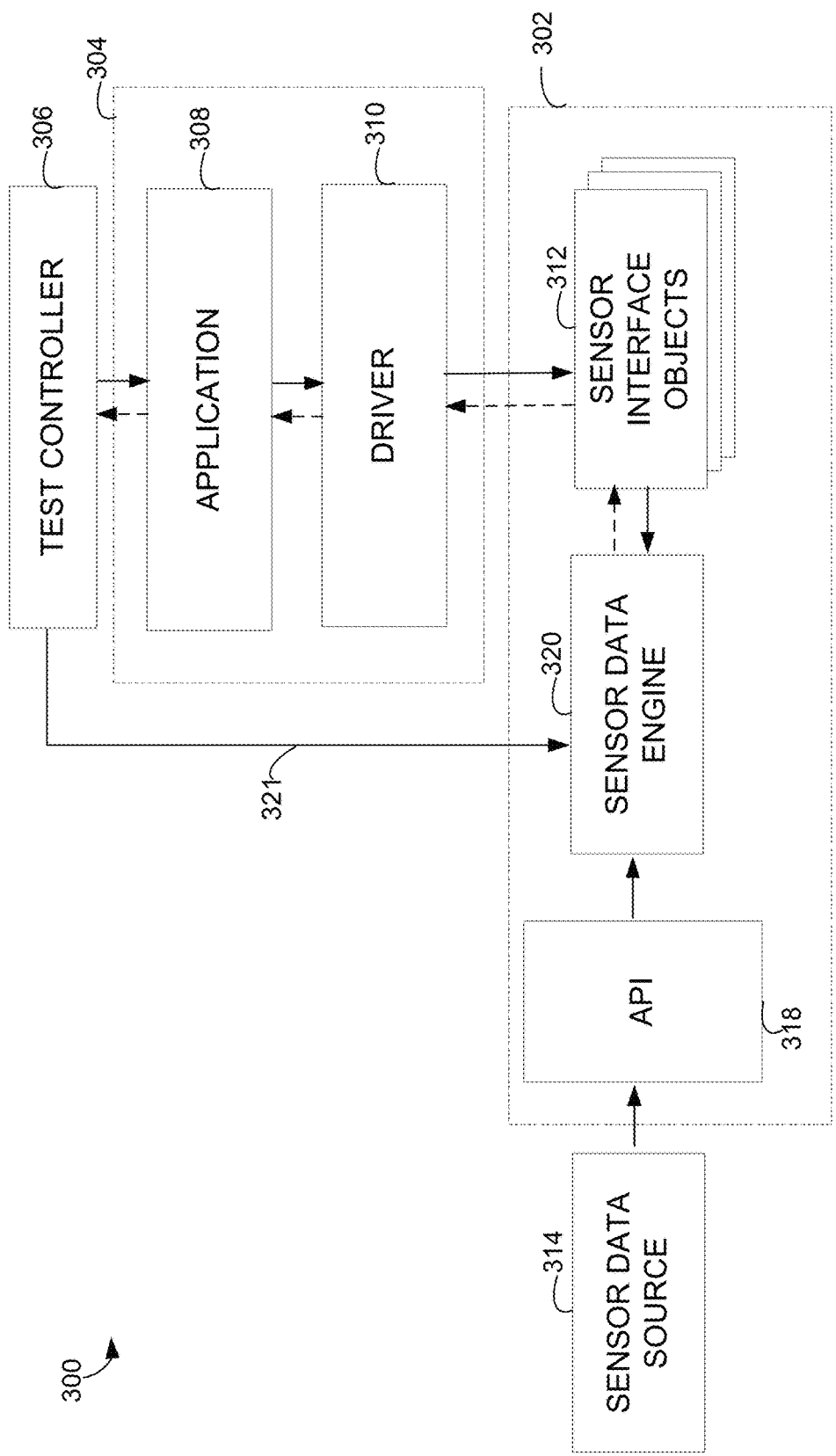
FIG. 3 is a functional block diagram of a framework for testing an application in accordance with some embodiments of the invention.

FIG. 3 is a block diagram of components of a framework 300 that may be used to test an application for execution in a device in accordance with some embodiments. Framework 300 may be deployed on a suitable computing device. For example, computer 206 (FIG. 2) may implement framework 300. Though, embodiments of the invention are not limited to any particular computing device in which framework 300 may be executed.

A computing device in which the framework may be implemented may include any other suitable components, which are not shown herein for the simplicity of the description. Thus, the computing device may comprise one or more tangible computer storage media. The computer storage media may be encoded with computer-executable instructions that, when executed with one or more suitable processors, may implement components of framework 300 shown in FIG. 3. The computer-executable instructions, when executed, may also implement any other suitable components for testing an application in accordance with some embodiments. The computing device may also include other types of memory, a user interface and multiple other components.

Framework 300 may include a development environment with a sensor emulation environment 302 that allows developing and testing applications for devices in a fast and efficient manner. The development environment may facilitate the testing by allowing any suitable sources of sensor data to be used for testing the applications. Sensor emulation environment 302 may execute in a host environment on a computer system on which the framework is implemented. That computer system may also support a guest environment in which an application environment 304 is created. Any suitable mechanism, including techniques as are known in the art, may be used to create such a guest environment.

Sensor emulation environment 302 and application environment 304 may execute on the same computing device. Though, it should be appreciated that embodiments of the invention are not limited to a particular manner in which sensor emulation environment 302 and application environment 304 are executed. Accordingly, sensor emulation environment 302 and application environment 304 may be executed on different computing devices. Also, components in these environments may be apportioned among more than one computing device in any suitable manner.

The framework also may comprise a test controller 306 that manages testing of an application 308. Test controller 306 may be any suitable component capable of testing behavior of the application in different contexts. For example, test controller 306 may be a test harness component which comprises computer-executable instructions that, when executed with one or more processors, enable automatically providing inputs and measuring outputs from the application. The test controller may be programmed with specific inputs to provide, and times at which they are to be provided. Such a test controller may be implemented using techniques as are known in the art. Also, test controller 306 may be implemented in any suitable environment. It may be implemented, for example, in the host environment or the guest environment. In some embodiments, test controller 306 may have multiple components, some of which may be implemented in the host environment and others may be implemented in the guest environment. Though, any suitable test controller may be utilized, as embodiments of the invention are not limited in this respect.

In operation, test controller 306 may test behavior of application 308. Thus, test controller 306 may be used to execute different tests on application 308, which may include supplying the application with sensor data. Accordingly, in addition to interacting with application 308, test controller 306 may interact with sensor emulation environment 302. Such interaction may specify to the sensor emulation environment parameters of a test, such as which data sources to access for sensor simulation data, and the start times for when data values from those data sources are valid.

Test controller 306 may generate outputs in any suitable format. In some scenarios, test controller 306 may provide results of the testing to a user in any suitable format. For example, test controller 306 may generate reports. The reports may be presented to the user on a user interface. Though, the specific output of test controller 306 is not crucial to the invention.

Sensor emulation environment 302 may emulate functionality of one or more physical sensors, including providing sensor simulation data for use in testing the application. Any suitable types of sensors may be emulated, such as sensors providing multi-touch data, GPS data, accelerometer, gyroscope, magnetometer, compass and any other suitable sensor data. The sensor emulation environment 302 may therefore dispose of the requirement for utilizing an actual target device for application testing.

As shown in FIG. 3, sensor emulation environment 302 may include sensor interface objects 312. Each of the sensor interface objects 312 may provide sensor simulation data to the application in a way that emulates supply of sensor data from a corresponding physical sensor.

In an actual target device, an application may interface to a sensor through a driver. Accordingly, application environment 304 may include a driver 310 for use in operating of application 308. Driver 310 allows application 308 to access sensor emulation environment 302 in the same manner in which it would access one or more actual sensors in the target device. Driver 310 may be a software program that may be loaded in an actual device for execution of application 308 and may be implemented using techniques as are known in the art. Thus, driver 310 may be capable of interfacing with an actual sensor to control the sensor and receive sensor data from it. It should be appreciated that one driver 310 is shown in FIG. 3 by way of example only as more than one driver may be utilized, and in some embodiments, a separate driver may be provided for each sensor that may be in the target device.

Sensor emulation environment 302 may connect to a sensor data source 314. Though one sensor data source 314 is shown for the sake of simplicity, it should be appreciated that sensor emulation environment 302 may connect to multiple data sources. The specific data source used may be specified by a test engineer, based on the type of tests to be performed. The data source may be selected, for example, based on behavior of application 308 that is being tested or based on any other suitable criteria. Sensor data source 314 may be a file, a process, a device, or any other suitable data source. In some embodiments, sensor data source 314 may be an actual device, such as a proxy device. In such cases, the sensor data may be received in real time from any suitable device having one or more sensors that may be different from a target device. In other embodiments, sensor data source 314 may be a simulation model generating sensor simulation data. Any suitable type of simulation model may be utilized as embodiments of the invention are not limited in this respect. The framework in accordance with some embodiments may be extended to any type of input sensor data.

Sensor emulation environment 302 may receive sensor simulation data from sensor data source 314 via an application programming interface (API) 318. The sensor simulation data may be provided to API 318 from any data source of multiple data any type. API 318 may be configured to receive any suitable type of sensor data. The API 318 may be implemented in any suitable manner. In one embodiment, API 318 may be implemented as follows:

```
[
            object,
            uuid(17181A0F-FDA1-4646-A89C-7555B9B41E53),
            helpstring("ISensorData Interface"),
            pointer_default(unique)
]
interface ISensorData: IUnknown
{
    HRESULT SetSensorReading([in]unsigned _int64 timeStamp,
[in]unsigned long cData, [in, size_is(cData)]SensorReading pData[ ]);
};
[helpstring("Accelaration reading along X, Y, Z axis in g m/s2") ]
typedef struct _AccelerometerReading
{
    double x;
    double y;
    double z;
}AccelerometerReading;
typedef struct _TouchInput
{
    long x;
    long y;
    unsigned long id;
    unsigned long flags;
}TouchInput;
typedef struct _TouchReading
{
    unsigned long cPoints;
    TouchInput points[4];
}TouchReading;
typedef enum GPSDataValidityFlags
{
    GPS_DATA_VALID_SPEED = 1,
    GPS_DATA_VALID_HEADING = 2,
    GPS_DATA_VALID_MAGNETIC_VARIATION = 4,
    GPS_DATA_VALID_ALTITUDE_SEALEVEL = 8,
    GPS_DATA_VALID_ALTITUDE_ELLIPSOID = 16,
    GPS_DATA_VALID_HORIZONTAL_ACCURACY =32,
    GPS_DATA_VALID_VERTICAL_ACCURACY =64
}GPSDataValidityFlags;
typedef struct GPSReading
{
            unsigned long validFields; //GPSDataValidityFlags
            //Below two fields are mandatory
    double latitude;
    double longitude;
            //Following fields are optional
            float speed;          // Speed in knots
    float heading;        // Degrees heading (course made good).
True North=0
            double magneticVariation; // Magnetic variation in degrees. East
is positive.
            float altitudeWRTSeaLevel; // Altitude with regards to sea level,
in meters
            float altitudeWRTEllipsoid; // Altitude with regards to ellipsoid,
in meters
            double horizontalAccuracy;   //Circular error in Meters
            @95%
            double verticalAccuracy;   //Circular error in Meters
            @95%
}GPSReading;
typedef enum _SensorReadingMessageID
    {
        InvalidSensorReadingMsg,
        TouchReadingMsg,
        AccelerometerReadingMsg,
        GPSReadingMsg,
    } SensorReadingMessageID;
    typedef [switch_type(SensorReadingMessageID)] union
_SensorReadingMessageData
    {
        [case(TouchReadingMsg)]
            TouchReading touchReading;
        [case(AccelerometerReadingMsg)]
            AccelerometerReading accelerometerReading;
        [case(GPSReadingMsg)]
            GPSReading gpsReading;
        [default]
            ;
    } SensorReadingMessageData;
    typedef struct _SensorReading
    {
        unsigned long offset;
        SensorReadingMessageID messageId;
        [switch_is(messageId)] SensorReadingMessageData
        messageData;
    }SensorReading;
```

As shown in FIG. 3, sensor emulation environment 302 may further comprise a sensor data engine 320 which may supply sensor simulation data to application 308. The sensor simulation data may be provided to application 308 via one or more different modes.

In a first, "push," mode, the sensor simulation data may be provided to application 308 in accordance with tests performed on the application. Thus, when one or more automated tests are performed on the application, sensor data required for the tests may be requested. Test controller 306 may perform one or more tests on application 308 and sensor simulation data may be fed into application 308 in accordance with the requirements of the tests. For example, when an automated test is performed on application 308, sensor data engine 320 may receive a command from test controller 306 to supply sensor simulation data to application 308, as shown by an arrow 321. In response to the command, sensor data engine 320 may supply sensor simulation data to an appropriate sensor interface object from sensor interface objects 312. The sensor interface object may in turn provide this data to application 308 at the appropriate time. For example, if sensor interface object is emulating a sensor in which an interrupt is generated by the sensor when new data is available, the sensor interface object may generate such an interrupt when it receives new data values from sensor data engine 320. As another example, if the sensor being emulated holds a current data value until read, the sensor interface object may receive and store in a buffer each value it receives from sensor data engine 320 such that the most recent value is available if application 308 requests data. Thus, in such scenarios, sensor data engine 320 "pushes" the sensor simulation data to the sensor interface object to make it available to application 308.

In some embodiments, the sensor data engine 320 may alternatively or additionally operate in a second mode, upon a request. Thus, application 308, driver 310 or even a sensor interface object 312, may request sensor data from sensor data engine 320. Accordingly, the sensor simulation data may be "pulled" from sensor data engine 320 in response to the request. In some embodiments, sensor simulation data may be obtained by sensor data engine 320 from a sensor data source prior to a time when the data is requested by application 308.

Accordingly, sensor data engine 320 may provide sensor simulation data for testing application 308 upon a command from test controller 306, in response a request from application 308 or driver 310, or in any other suitable manner. Regardless of the way in which the request for sensor data is received by sensor data engine 320, sensor data engine 320 may obtain sensor simulation data, via API 318, from a sensor data source and supply the sensor simulation data to the application.

Sensor data engine 320 may be implemented in any suitable manner. In one embodiment, sensor data engine 320 may be implemented in accordance with the following specification.

typedef HRESULT (*SubmitSensorData)(unsigned long timestamp, SensorReadingMessageID message, const SensorReadingMessageData* pData);

```
class SensorDataEngine
{
    /* This method is called by COM API to submit new sensor
    data.
    deltaOffset represent delta to be added to offset reading due to
COM call latency (message received timestamp – message sent time
stamp).*/
        HRESULT SubmitSensorData(long deltaOffset, unsigned long
cData, const SensorReading* pReadings);
    /* Sensor devices registers callback during InitializeEmulation */
        HRESULT
RegisterSensorDataCallback(SensorReadingMessageID
messageId, SubmitSensorData pfnCallback);
        HRESULT
DeRegisterSensorDataCallback(SensorReadingMessageID messageId);
            /* This call triggers callback method if sensor data for current
timestamp is available */
        HRESULT CheckSensorData(SensorReadingMessageID
        message);
}
```

In this example, for each SensorReadingMessageID, the sensor data engine may maintain sensor reading messages in a linked list. Each node in the linked list may be represented as follows:

```
    struct SensorDataNode
    {
        SensorDataNode* pNext;
        unsigned long timeStamp;
        SensorReadingMessageData messageData;
    };
    //SensorDataEngine will have multiple SensorDataList
    objects, one for each SensorReadingMessageID
    struct SensorDataList
    {
        SensorReadingMessageID messageId;
        SensorDataNode* pHead;
        SensorDataNode* pTail;
        SubmitSensorData pfnCallback;
    };
```

A pseudo code for a worker thread in SensorDataEngine that is responsible for submitting sensor data at a scheduled time is shown below.

```
int SubmitSensorDataThreadMethod( )
{
    DWORD timeout=INFINITE;
    while(1)
    {
        DWORD retval=
::WaitForSingleObject(SensorDataPendingEvent, timeout);
        if(retval == SensorDataPendingEvent is set)
        {
            recompute timeout (=delta time for next data push);
        }
        else if (retval == timeout)
        {
            Submit data to sensor(s);
            recompute timeout;
        }
    }
}
```

The pseudo code for SubmitSensorData method may be represented as follows:

```
SubmitSensorData( )
{
    for(each message in set)
    {
        Compute timestamp of message;
            if((Message.timestamp < previous
            Message.timestamp))
        {
            return error;
        }
        if ((Message.timestamp < currentTimeStamp) &&
((currentTimeStamp –
Message.timestamp)>MAX_MESSAGE_DELAY))
        {
            return error;
        }
            if (Message.timestamp <= currentTimeStamp)
        {
            submit data to sensor;
            return;
        }
        else
        {
            create SensorDataNode;
            add SensorDataNode to SensorDataList;
            if(SensorDataNode is added as head of list)
            {
                set SensorDataPendingEvent;
            }
        }
    }
}
```

Figure 4:
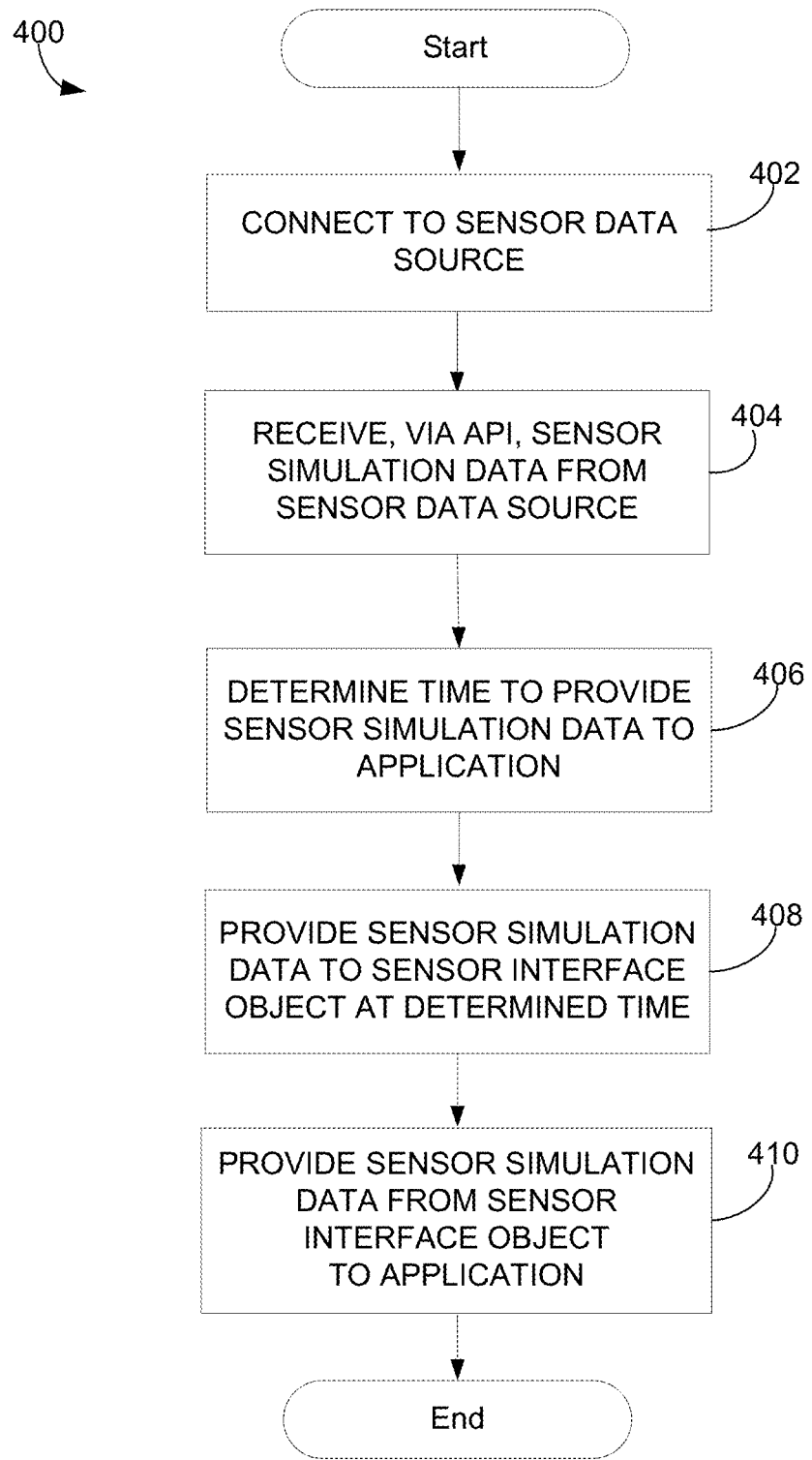
FIG. 4 is a flow chart of a method of providing sensor simulation data for testing an application in a first mode in accordance with some embodiments of the invention.

FIG. 4 illustrates a process 400 of testing an application for a target device in which the sensor emulation environment is operating in a first mode. The first mode may be referred to as a "push" mode because, in this mode, sensor simulation data may be generated by a sensor data engine, even when the application, or other component, did not specifically request the data. The target device may be any suitable device equipped with one or more sensors. For example, the target device may be a mobile computing device equipped with one or more sensors, such as a Smartphone, personal digital assistant and other type of a device. It should be appreciated that embodiments of the invention are not limited to any particular type of a target device.

Process 400 may be executed within a framework for testing the application in accordance with some embodiments of the invention. The framework may be a framework 300 (FIG. 3). The application may be executed in an application environment (e.g., application environment 304 in FIG. 3).

Process 400 may start at any suitable time. For example, process 400 may start when test controller 306 or other suitable component for testing an application is initiated. To initiate process 400, an instruction may be received from a user, from a suitable program, or in any other suitable manner. Moreover, process 400 may start in response to any other suitable trigger. The trigger may initiate operation of a sensor emulation environment (e.g., sensor emulation environment 302 in FIG. 3) within the framework. Though, in some scenarios, the sensor emulation environment may be already operating when process 400 starts.

As shown in FIG. 4, at block 402, the sensor emulation environment may connect to a sensor data source. The sensor data source may be a simulation model, a file, a process, a device that may be different from a target device, or any other suitable data source. Connecting to the sensor data source may comprise selecting a source of sensor simulation data. The selecting of the sensor data source may involve receiving input from test controller 306. For example, as discussed above, test controller 306 may instruct a sensor data engine (e.g., sensor data engine 320 in FIG. 3) to supply sensor data to a corresponding sensor interface object from which it may be supplied to application 308. In some scenarios, the input may be received from a driver for use in operating the application (e.g., driver 310 in FIG. 3) or from any other suitable component.

At block 404, the sensor simulation data may be received from the selected source of sensor simulation data. The data may be received by sensor data engine 320, via an API, such as API 318 (FIG. 3). The API may be configured to receive different types of sensor simulation data from various types of data sources.

Next, at block 406, a time to provide sensor simulation data to the application may be determined. As described above, the sensor simulation data may be provided with timing information, which indicates the time at which each data series, and each data value within that series, is valid. In the "push" mode, this timing information may be used by the sensor data engine to determine a time at which to output each value in a data series.

When the time to provide the sensor simulation data to the application is determined, at block 406, the sensor simulation data may be provided to a sensor interface object at block 408. The sensor emulation environment may comprise multiple sensor interface objects emulating interfaces to respective actual sensors (e.g., sensor interface objects 312 in FIG. 3). Hence, each sensor interface object may be implemented so that it can provide sensor simulation data to the application. Data points in the sensor simulation data may be associated with an identifier for a sensor interface object to pass the data to the application. The sensor data engine may thus determine, based on the identifier, the sensor interface object to receive the sensor simulation data and pass the data to the application. Though, any suitable mechanism may be used to determine which sensor interface object is to receive the sensor data.

Next, at block 410, the sensor interface object may supply the sensor simulation data to the application executing in the application environment. A driver for use in operating the application (e.g., driver 310) may receive the sensor simulation data from the sensor interface object and supply the sensor simulation data to the application. Process 400 may then end. Though, it should be appreciated that process 400 may execute continuously so that the sensor data engine may continuously feed the sensor simulation data to the application.

FIG. 4 illustrates the process of supplying sensor simulation data by the sensor data engine to the application in the first, "push," mode. In some embodiments, the application being tested using the techniques described herein, or any other component including the sensor interface object or a driver, may request sensor data from the sensor emulation environment. Accordingly, in such embodiments, the sensor simulation data may be "pulled" from the sensor data engine upon a request.

Figure 5:
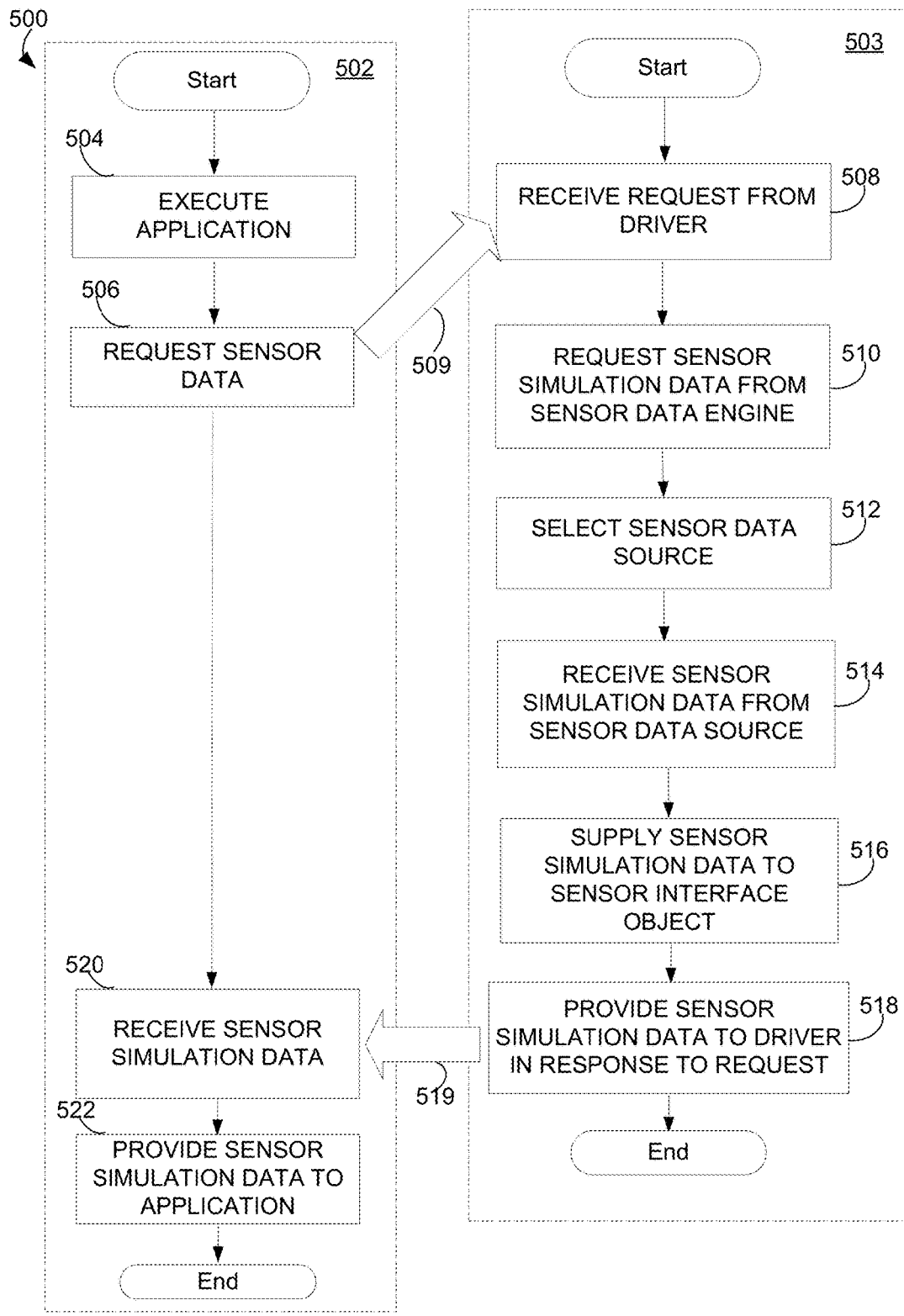
FIG. 5 is a flow chart of a method of providing sensor simulation data for testing an application in response to a request from the application in a second mode in accordance with some embodiments of the invention.

FIG. 5 illustrates a process 500 of supplying sensor data for use in an application being tested upon a request. In this example, the request is generated by the application under test. Process 500 may be implemented in framework 300 shown in FIG. 3. Process 500 may comprise processes 502 and 503 executed within an application environment (e.g., application environment 304 in FIG. 3) and a sensor emulation environment (e.g., sensor emulation environment 302 in FIG. 3), respectively.

Process 502, executed in application environment 304, may start when the application under test (e.g., application 308 in FIG. 3) is executed, at block 504. A suitable component, such as test controller 306 (FIG. 3) may execute various tests on the application. During the testing, at block 506, the application may execute functionality that, in an actual target device, would be performed using sensor data, and the application may request that sensor data. The application may request the sensor data via a driver for use in operating the application (e.g., driver 310 in FIG. 3). The driver may thus request the sensor data from the sensor emulation environment.

When the driver requests the sensor data from the sensor emulation environment, process 500 may continue as process 503, as shown schematically in FIG. 3 by an arrow 509. Process 503 is shown by way of example to initiate in the sensor emulation environment when the request for the sensor data is received from the driver. The sensor emulation environment may be in an operational state when process 503 initiates.

The sensor emulation environment may comprise multiple sensor interface objects each emulating an interface to one or more respective physical sensors. The driver in the application environment requesting sensor data may be a driver that would interact with an actual physical sensor. An appropriate sensor interface object, emulating the sensor with which the driver is intended to interact in the physical target device, may receive the request from the driver, at block 508. The sensor interface object may then pass request to a sensor data engine (e.g., sensor data engine 320 in FIG. 3), as shown in block 510. The sensor data engine may supply sensor simulation data in response to the request. The request may be for a single data value or a stream of data values that may be returned over time.

At block 512, a source of sensor data to supply those data values may be selected in any suitable manner. The sensor data source, for example, may be sensor data source 314 (FIG. 3). The sensor emulation environment may be configured to connect to a sensor data source, which may comprise selecting the sensor data source. The sensor data source may be selected in any suitable manner and via any suitable component. For example, a test controller controlling testing of the application may indicate a sensor data source to select at a start of a test. Alternatively or additionally, one or more data sources, each providing sensor simulation data for a different type of sensor, may be connected to the sensor emulation environment such that selection of a data source may involve selecting a data source providing data for a sensor of the type to be emulated.

It should be appreciated that the selection of a sensor data source at block 512 is shown to occur after the request for sensor data is received by way of example only. In some embodiments, the sensor data source may be selected prior to a receipt of the request for the sensor data. For example, the test controller may indicate to the sensor data engine the sensor data source to select when one or more tests are started on the application. In some embodiments, the sensor data engine may load the sensor simulation data before the data is requested by the application. The loaded sensor simulation data may be stored in any suitable location so that the sensor data engine may access the sensor simulation data and provide the data to the application upon a request. For example, the loaded sensor simulation data may be stored in one or more memories of any suitable type which may be located on or otherwise associated with a computing device (e.g., computing device 206 in FIG. 2) in which the sensor emulation environment is executed.

Referring back to FIG. 5, next, at block 514, the sensor data engine may receive the sensor simulation data, via a suitable API (e.g., API 318), from the selected sensor data source. After the sensor data engine receives the sensor simulation data via the API, the sensor data engine may supply the sensor simulation data to appropriate one or more sensor interface objects, at block 516, at the appropriate times. Next, at block 518, the sensor interface object(s) may provide the sensor simulation data to the driver that requested the sensor data. As shown in FIG. 5 by an arrow 519, at block 520, process 500 may thus return to process 502 executed in the application environment.

Accordingly, the driver that provided the request for the sensor data may receive sensor simulation data that emulates data provided by an actual physical sensor. The driver may then provide the received sensor simulation data to the application, at block 522. A test controller in the development environment or any other suitable component may thus test behavior of the application in response to the sensor simulation data inputted to the application. Any suitable test may be performed on the application using the sensor simulation data. The test may involve executing one or more test programs or may be performed in any other suitable manner. Results of the tests may be provided to a user in any suitable format.

Figure 6:
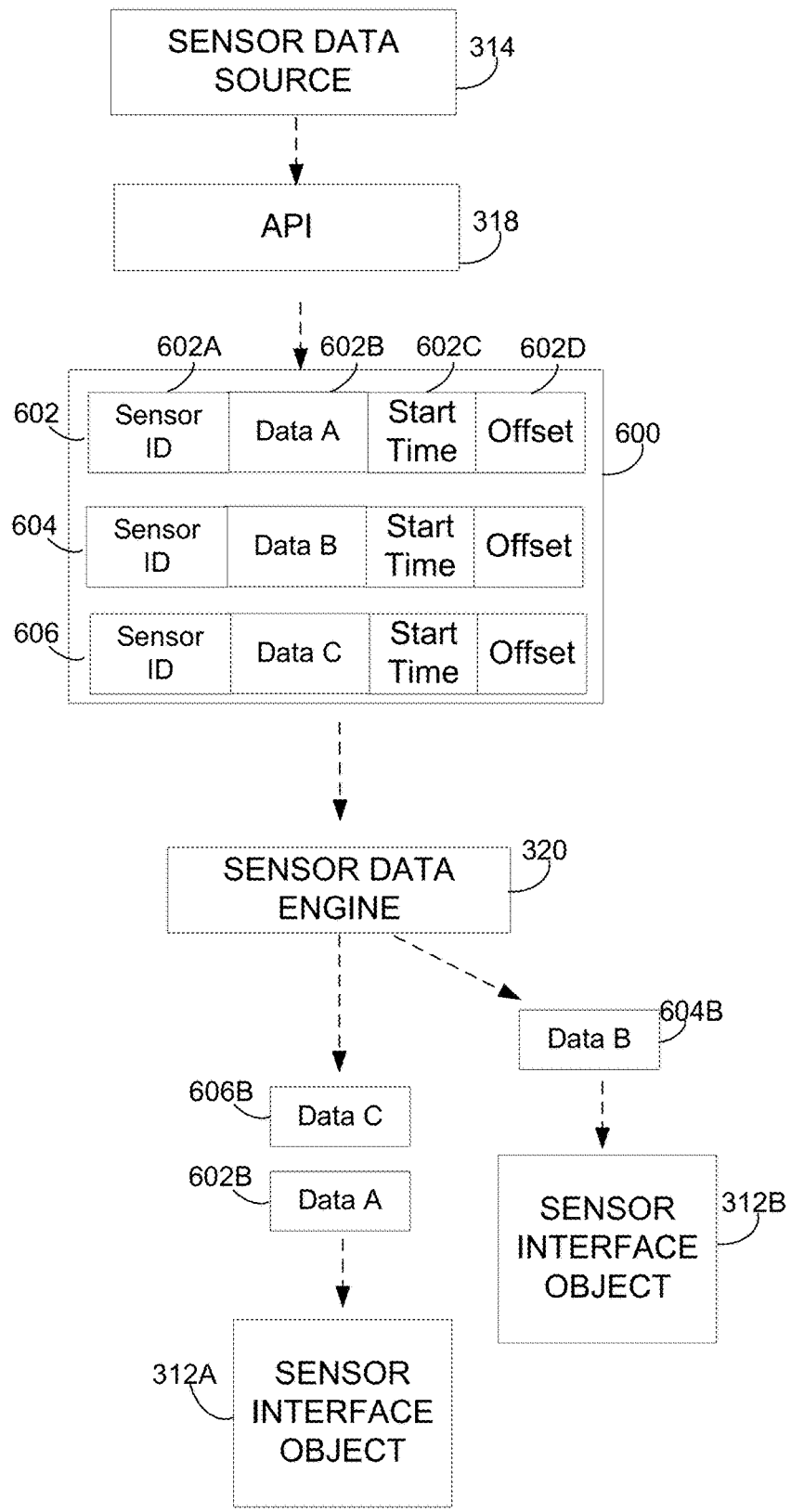
FIG. 6 is a sketch illustrating data flow during a method of providing sensor simulation data to an appropriate sensor interface object in accordance with some embodiments of the invention.

FIG. 6 illustrates a method of providing sensor simulation data to one or more sensor interface objects, in accordance with some embodiments of the invention. Each of the sensor interface objects (e.g., sensor interface objects 312 in FIG. 3) may emulate an interface to an actual physical sensor for passing data between a driver for controlling the sensor and the sensor itself. The method shown in FIG. 6 may be performed in the sensor emulation environment described herein.

In some embodiments, a test controller, one, or more of other suitable components for testing an application may indicate to the sensor data engine information that provides a time reference. This information may indicate a time when testing of the application is to start, defining a time zero in the reference time. Though, the time reference may be provided in any other suitable way, such as by indicating a time at which data is to be provided. In response to this indication, the sensor data engine may begin operating so as to provide sensor simulation data to the application. The sensor data engine may "push" the sensor simulation data to the application or, in a "pull" mode, may respond to a request for sensor data from the application.

Each data point in the sensor simulation data may be associated with one or more parameters that may be processed by the sensor data engine to provide the sensor simulation data to the application. FIG. 6 shows schematically that sensor simulation data 600 may be received from a sensor data source, such as, for example, sensor data source 314, via API 318. The sensor data source may be of any suitable type and may be selected in any suitable manner to provide sensor simulation data 600 to an application under testing. Sensor simulation data 600 may represent any suitable type of sensor data. For example, sensor simulation data 600 may represent output of one or more sensors as a result of a gesture (e.g., a shake) or other manipulation performed with a mobile device. Though, embodiments of the invention are not limited in this respect and sensor simulation data may represent sensor data of any type obtained in any suitable manner.

The framework for testing an application by using sensor simulation data in accordance with some embodiments may be used to receive such data from any type of a data source. The framework may be used to test the application in a programmatic manner. The sensor simulation data may comprise information that facilitates testing the application in the programmatic manner. That information may include timing information, indicating a time when to supply sensor simulation data to the application. The information may also comprise an identifier for one or more sensors that the data is intended to emulate. The sensors may be specified in any suitable format, including a label of the sensor. Though, the sensor to be emulated may be described in other ways, including by identifying interface objects through which the sensor simulation data may be passed from the sensor emulation environment to the application. Thus, sensor data engine 320 may process sensor simulation data 600 to determine to what sensor interface object(s) and at what time to provide the sensor simulation data.

In this example, sensor simulation data 600 comprises three data points 602, 604 and 606. Each of the data points may comprise a plurality of fields. In this example, fields of only one of the data points, 602, are labeled for the sake of simplicity. Though, in this example, each of the data points includes the same fields. Thus, data point 602 within sensor simulation data 600 includes a field 602A storing a sensor identifier, field 602B storing actual data "data A," field 602C comprising a start time and field 602D storing an offset. Data points 604 and 606 may comprise similar fields. In this example, the actual data, such as "data A" in field 602B represents a sensor data value that is inputted to the application during testing of the application. Field 602A stores information identifying a sensor to be emulated with the data. Fields 602C and 603C store timing information. In this example, the timing information is stored in the start time/offset format described above. However, any suitable format may be used.

It should be appreciated that the data points of the sensor simulation data are shown by way of example to include the illustrated fields arranged in this order. The sensor simulation data may comprise any number of fields for recording any suitable data, in any suitable order.

Sensor data engine 320 may use, in this example, sensor data identifiers, such as a sensor identifier in sensor identifier field 602A of data point 602 and similar sensor identifiers of data points 604 and 606, to determine one or more sensor interface objects (e.g., sensor interface objects 312 in FIG. 3) to receive the sensor simulation data. FIG. 6 shows that sensor data engine 320 may provide sensor data, such as "data C" 606B and "data A" 602B, to sensor interface object 312A, based on sensor identifiers for these data which, in this example, indicate the same sensor interface object 312A. Data point "data B" 604B may be provided to sensor interface object 312B, based on the sensor identifier for "data B" 604B. The sensor data may be provided to respective sensor interface objects at a time indicated in the start time field and an offset as indicated by the offset field.

In this example, the start time 602C may indicate a time when the data (i.e., actual data "data A" 602B) is to be pushed from the sensor data engine to an appropriate sensor interface object. The start time may be represented as a timestamp and may be set in any suitable manner. For example, a suitable component, such as a test controller that may automatically execute tests on the application, may specify the timestamp. When the source of sensor simulation data, such as a data file, comprises stored data, the start time may be added to the data file to indicate when, during execution of a test program, to push the data to the sensor interface object. Alternatively or additionally, if there is no start time in the file, the start time may be assumed to be the time at which an event is detected. When the source of sensor simulation data comprises a program or a process providing the sensor simulation data, such program or process may associate the sensor simulation data with the timestamps to indicate a time when these data is to be used for testing the application.

As another example, when the source of sensor simulation data comprises a simulation model generating the sensor simulation data, the simulation model may generate the timestamps and assign them to the sensor simulation data. Regardless of which way is used to set the value of the timestamp, this value may be used by the sensor data engine to determine when to push data to an appropriate sensor interface object that then passes the data to the application.

The sensor interface object may pass the data to the application at a time that may be different from a value of the start time. In addition to the start time, each data point in sensor simulation data may include an offset value indicating an offset from the start time. The offset value allows maintaining timing relationship between data points. In the example illustrated, the value of offset 602D may be added to the value of start time 602C to determine a time when to provide the "data A" 602B of data point 602 to the application. Offset values may allow providing multiple data points of the sensor simulation data at the same time. For example, a series of values of the sensor simulation data that represent a gesture, such as a shake of a device or any other suitable movement of the device, may be provided to the application at the same time.

It should be appreciated that different types of sensor simulation data may include different number of different fields, as embodiments of the invention are not limited in this respect. For example, in embodiments in which sensor data is collected via a proxy device in real time, data points in the sensor simulation data may not be associated with a start time. Furthermore, in the "pull" mode, when the sensor data engine provides sensor simulation data in response to a request from the application, even if sensor simulation data is associated with timing parameters such as a start time and an offset, these parameters may not be used. Though, in some embodiments, even when a pull model is used, a request may override the start time, but the offsets may still be applied relative to that start time.

Figure 7:
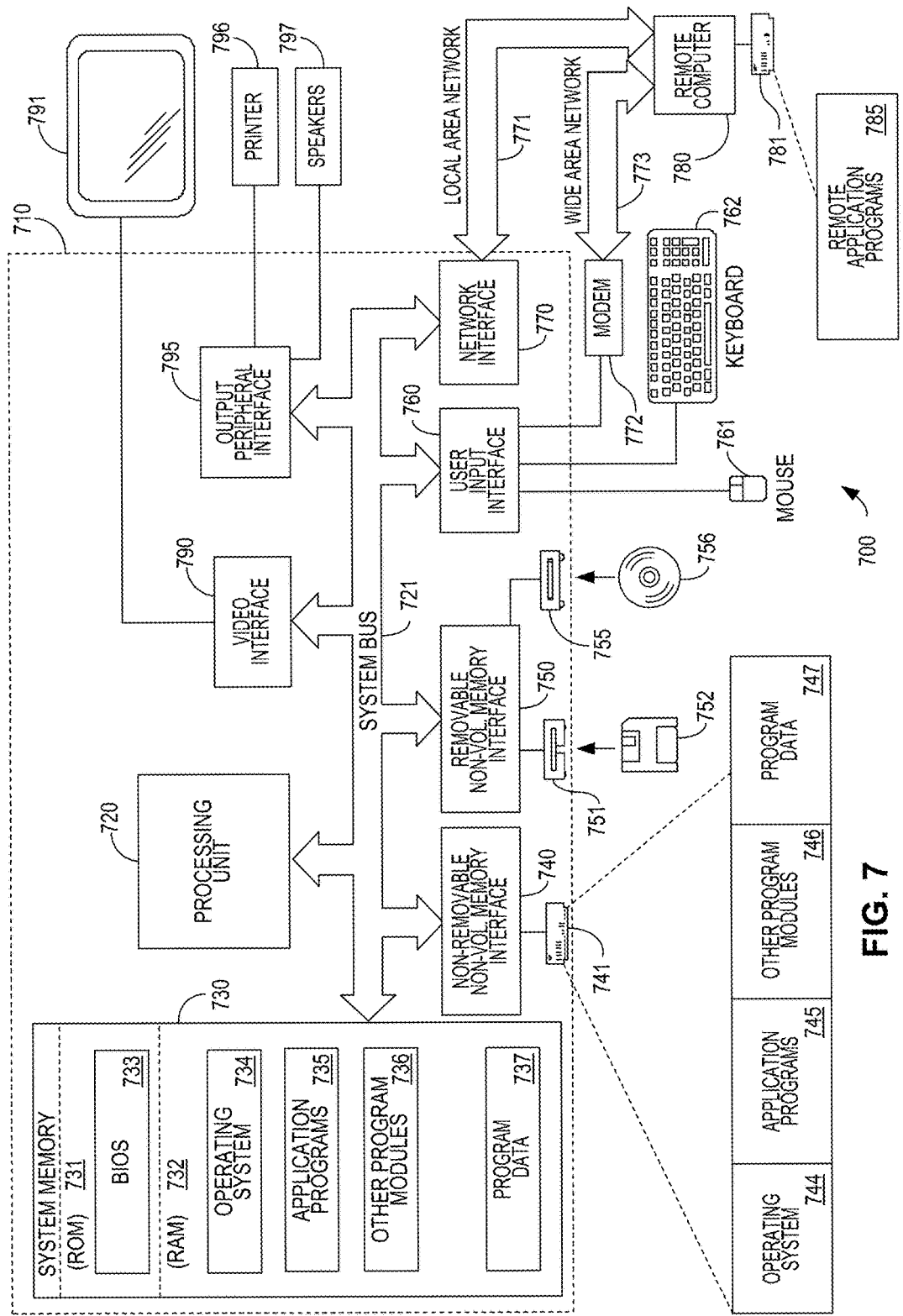
FIG. 7 is a functional block diagram of a computing device that may be used in implementing some embodiments of the invention.

The framework may run in any suitable computing environment. FIG. 7 illustrates an example of a suitable computing system environment 700 on which the invention may be implemented. The computing system environment 700 is only one example of a suitable computing environment and is not intended to suggest any limitation as to the scope of use or functionality of the invention. Neither should the computing environment 700 be interpreted as having any dependency or requirement relating to any one or combination of components illustrated in the exemplary operating environment 700.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 7, an exemplary system for implementing the invention includes a general purpose computing device in the form of a computer 710. Components of computer 710 may include, but are not limited to, a processing unit 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 710 typically includes a variety of computer readable media. Computer readable media can be any available media that can be accessed by computer 710 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 710. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 730 includes computer storage media in the form of volatile and/or nonvolatile memory such as read only memory (ROM) 731 and random access memory (RAM) 732. A basic input/output system 733 (BIOS), containing the basic routines that help to transfer information between elements within computer 710, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, application programs 735, other program modules 736, and program data 737.

The computer 710 may also include other removable/non-removable, volatile/nonvolatile computer storage media. By way of example only, FIG. 7 illustrates a hard disk drive 740 that reads from or writes to non-removable, nonvolatile magnetic media, a magnetic disk drive 751 that reads from or writes to a removable, nonvolatile magnetic disk 752, and an optical disk drive 755 that reads from or writes to a removable, nonvolatile optical disk 756 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as interface 750.

The drives and their associated computer storage media discussed above and illustrated in FIG. 7, provide storage of computer readable instructions, data structures, program modules and other data for the computer 710. In FIG. 7, for example, hard disk drive 741 is illustrated as storing operating system 744, application programs 745, other program modules 746, and program data 747. Note that these components can either be the same as or different from operating system 734, application programs 735, other program modules 736, and program data 737. Operating system 744, application programs 745, other program modules 746, and program data 747 are given different numbers here to illustrate that, at a minimum, they are different copies. A user may enter commands and information into the computer 710 through input devices such as a keyboard 762 and pointing device 761, commonly referred to as a mouse, trackball or touch pad. Other input devices (not shown) may include a microphone, joystick, game pad, satellite dish, scanner, or the like. These and other input devices are often connected to the processing unit 720 through a user input interface 760 that is coupled to the system bus, but may be connected by other interface and bus structures, such as a parallel port, game port or a universal serial bus (USB). A monitor 791 or other type of display device is also connected to the system bus 721 via an interface, such as a video interface 790. In addition to the monitor, computers may also include other peripheral output devices such as speakers 797 and printer 796, which may be connected through an output peripheral interface 795.

The computer 710 may operate in a networked environment using logical connections to one or more remote computers, such as a remote computer 780. The remote computer 780 may be a personal computer, a server, a router, a network PC, a peer device or other common network node, and typically includes many or all of the elements described above relative to the computer 710, although only a memory storage device 781 has been illustrated in FIG. 7. The logical connections depicted in FIG. 7 include a local area network (LAN) 771 and a wide area network (WAN) 773, but may also include other networks. Such networking environments are commonplace in offices, enterprise-wide computer networks, intranets and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the user input interface 760, or other appropriate mechanism. In a networked environment, program modules depicted relative to the computer 710, or portions thereof, may be stored in the remote memory storage device. By way of example, and not limitation, FIG. 7 illustrates remote application programs 785 as residing on memory device 781. It will be appreciated that the network connections shown are exemplary and other means of establishing a communications link between the computers may be used.

Having thus described several aspects of at least one embodiment of this invention, it is to be appreciated that various alterations, modifications, and improvements will readily occur to those skilled in the art.

For example, embodiments are described herein in which the sensor emulation environment provides data on a single sensor. However, it should be appreciated that the environment supports simulating multiple sensors at once. The sensor data engine may provide valid data, at appropriate times, for each of the sensors being simulated. Data for each sensor may be supplied through a sensor interface object appropriate for that type of sensor and the application, or corresponding driver as appropriate, may receive data from all of the simulated sensors.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable storage medium or media can be transportable, such that the program or programs stored thereon can be loaded onto one or more different computers or other processors to implement various aspects of the present invention as discussed above. As used herein, the term "non-transitory computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. In a computer comprising at least one processor, a method of testing an application for a mobile computing device, the method comprising:
   with the at least one processor:
   connecting a sensor emulation environment to a source of sensor simulation data;
   receiving, by the sensor emulation environment via an application programming interface, the sensor simulation data from the source of sensor simulation data;
   determining, by the sensor emulation environment, a time to provide the sensor simulation data to a sensor interface component, said determining comprising processing at least one timing parameter of the sensor simulation data that comprises a start time and an offset;
   providing, from the sensor data engine, the sensor simulation data to the sensor interface component that emulates an interface to a physical sensor at the determined time, the sensor data engine being operable to provide the sensor simulation data in accordance with a first operating mode and a second operating mode, the first operating mode causing the sensor simulation data to be provided to the sensor interface component in response to receiving a request for the sensor simulation data originating from a test controller that performs one or more automated tests on the application, the second operating mode causing the sensor simulation data to be provided to the sensor interface component in response to receiving a request for the sensor simulation data originating from the application; and providing the sensor simulation data from the sensor interface component to the application.

2. The method of claim 1, wherein connecting to the source of sensor simulation data comprises selecting the source of sensor simulation data.

3. The method of claim 1, wherein the source of sensor simulation data comprises a simulation model for generating the sensor simulation data.

4. The method of claim 1, wherein the source of sensor simulation data comprises at least one selected from the group consisting of a device, a file, or a process.

5. The method of claim 4, wherein the source of sensor simulation data is the device, and the device is different from the mobile computing device.

6. The method of claim 1, wherein the application programming interface and the sensor interface component execute in the sensor emulation environment and the application executes in an application environment.

7. The method of claim 1, wherein the sensor emulation environment and the application environment are located on a same computing device.

8. The method of claim 1, wherein the sensor simulation data comprises a plurality of data points and each data point from the plurality of data points is associated with the start time and the offset that are utilized by the sensor emulation environment to determine a time to provide the sensor simulation data.

9. The method of claim 8, wherein the sensor interface component receives the plurality of data points at the same time.

10. A computer system comprising at least one processor for testing an application for a mobile device, the computer system comprising:
a sensor emulation environment configured to:
receive a request for sensor data originating from the application;
in response to the request, receive, via an application programming interface, sensor simulation data from a source of sensor simulation data;
determine a time to provide the sensor simulation data to at least one sensor interface component by processing at least one timing parameter of the sensor simulation data that comprises a start time and an offset;
provide the sensor simulation data to the at least one sensor interface component, the sensor simulation data being provided at the determined time; and
provide, from the at least one sensor interface component, the sensor simulation data to the application.

11. The computer system of claim 10, wherein the sensor simulation data comprises a plurality of data points and each data point from the plurality of data points is associated with the start time and the offset that are utilized by the sensor data engine to determine a time to provide the sensor simulation data to the application.

12. The computer system of claim 10, wherein the at least one sensor interface component receives the plurality of data points at the same time.

13. The computer system of claim 10, wherein
the sensor emulation environment determines at least one sensor interface component based on an identifier included in or received in conjunction with the sensor simulation data.

14. At least one computer-readable memory encoded with computer executable instructions that, when executed by at least one processor, perform a method of supplying simulated sensor data for testing an application for a mobile computing device, the method comprising:
receiving, via at least one sensor interface component, a request for sensor data originating from the application;
in response to the request, obtaining, by a sensor emulation environment, sensor simulation data from an application programming interface, wherein the application programming interface receives the sensor simulation data from a source of sensor simulation data;
determining, by the sensor emulation environment, a time to provide the sensor simulation data to the at least one sensor interface component by processing at least one timing parameter of the sensor simulation data that comprises a start time and an offset;
providing, by the sensor emulation environment, the sensor simulation data to the at least one sensor interface component, the sensor simulation data being provided at the determined time; and
providing, by the at least one sensor interface component, the sensor simulation data to the application.

15. The at least one computer-readable memory of claim 14, wherein the method further comprises connecting to the source of sensor simulation data, the connecting comprising selecting the source of sensor simulation data.

16. The at least one computer-readable memory of claim 14, wherein the source of sensor simulation data comprises at least one selected from the group consisting of a device, a file, a process or a simulation model.

17. The at least one computer-readable memory of claim 14, wherein the device is different from the mobile computing device.

18. The at least one computer-readable memory of claim 14, wherein the sensor emulation environment determines at least one sensor interface component based on an identifier included in or received in conjunction with the sensor simulation data.

19. The at least one computer-readable memory of claim 14, wherein the sensor simulation data comprises a plurality of data points and each data point from the plurality of data points is associated with the start time and the offset that are utilized by the sensor emulation environment to determine a time to provide the sensor simulation data to the application.

20. The at least one computer-readable memory of claim 19, wherein the at least one sensor interface component receives the plurality of data points at the same time.

* * * * *